(12) United States Patent
Baars et al.

(10) Patent No.: US 9,023,696 B2
(45) Date of Patent: May 5, 2015

(54) METHOD OF FORMING CONTACTS FOR DEVICES WITH MULTIPLE STRESS LINERS

(75) Inventors: Peter Baars, Dresden (DE); Marco Lepper, Dresden (DE); Thilo Scheiper, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 31 days.

(21) Appl. No.: 13/116,672

(22) Filed: May 26, 2011

(65) Prior Publication Data

US 2012/0299160 A1 Nov. 29, 2012

(51) Int. Cl.
*H01L 21/8238* (2006.01)

(52) U.S. Cl.
CPC ...... *H01L 21/823807* (2013.01); *H01L 21/823864* (2013.01); *H01L 21/823871* (2013.01)

(58) Field of Classification Search
CPC .............. H01L 21/823807; H01L 21/823864; H01L 21/823871
USPC .................................. 438/199; 257/E21.632
See application file for complete search history.

(56) References Cited

U.S. PATENT DOCUMENTS

| | | | |
|---|---|---|---|
| 7,521,308 B2 | 4/2009 | Nair et al. | |
| 7,585,720 B2 | 9/2009 | Sudo | |
| 7,652,335 B2 | 1/2010 | Miyashita | |
| 7,659,171 B2 | 2/2010 | Furukawa et al. | |
| 7,675,118 B2 | 3/2010 | Chidambarrao et al. | |
| 7,727,834 B2 | 6/2010 | Sudo | |
| 7,816,271 B2 | 10/2010 | Lee et al. | |
| 7,834,399 B2 | 11/2010 | Kanarsky et al. | |
| 7,863,201 B2 | 1/2011 | Jeong et al. | |
| 7,968,915 B2 | 6/2011 | Kanarsky et al. | |
| 8,004,035 B2 | 8/2011 | Sudo | |
| 2007/0111420 A1* | 5/2007 | Chou et al. | 438/199 |
| 2008/0087967 A1* | 4/2008 | Kim | 257/369 |
| 2009/0020791 A1* | 1/2009 | Yu et al. | 257/288 |

* cited by examiner

*Primary Examiner* — Hsin-Yi Hsieh
(74) *Attorney, Agent, or Firm* — Amerson Law Firm, PLLC

(57) ABSTRACT

Disclosed herein is a method of forming a semiconductor device. In one example, the method includes performing a first process operation to form a first etch stop layer above a first region of a semiconducting substrate where a first type of transistor device will be formed, and forming a first stress inducing layer at least above the first etch stop layer in the first region, wherein the first stress inducing layer is adapted to induce a stress in a channel region of the first type of transistor. The method further includes, after forming the first etch stop layer, performing a second process operation form a second etch stop layer above a second region of the substrate where a second type of transistor device will be formed, and forming a second stress inducing layer at least above the second etch stop layer in the second region, wherein the second stress inducing layer is adapted to induce a stress in a channel region of the second type of transistor. In one particular example, the first and second etch stop layers may have the same approximate thickness.

20 Claims, 6 Drawing Sheets

METHOD OF FORMING CONTACTS FOR DEVICES WITH MULTIPLE STRESS LINERS

BACKGROUND OF THE INVENTION

1. Field of the Invention

Generally, the present disclosure generally relates to the manufacturing of sophisticated semiconductor devices, and, more specifically, to a method forming conductive contacts on semiconductor devices that include two or more stress liners for inducing desired stresses in the channel regions of the devices.

2. Description of the Related Art

The fabrication of advanced integrated circuits, such as CPUs, storage devices, ASICs (application specific integrated circuits) and the like, requires a large number of circuit elements to be formed on a given chip area according to a specified circuit layout, wherein field effect transistors represent one important type of circuit element that substantially determines performance of the integrated circuits. Generally, a plurality of process technologies are currently practiced, wherein, for many types of complex circuitry, including field effect transistors, MOS technology is currently one of the most promising approaches due to the superior characteristics in view of operating speed and/or power consumption and/or cost efficiency. During the fabrication of complex integrated circuits using, for instance, MOS technology, millions of transistors, e.g., N-channel transistors (NMOS) and/or P-channel transistors (PMOS), are formed on a substrate including a crystalline semiconductor layer. A field effect transistor, irrespective of whether an N-channel transistor or a P-channel transistor is considered, typically comprises so-called PN junctions that are formed by an interface of highly doped regions, referred to as drain and source regions, with a slightly doped or non-doped region, such as a channel region, disposed adjacent to the highly doped regions.

In a field effect transistor, the conductivity of the channel region, i.e., the drive current capability of the conductive channel, is controlled by a gate electrode formed adjacent to the channel region and separated therefrom by a thin insulating layer. The conductivity of the channel region, upon formation of a conductive channel due to the application of an appropriate control voltage to the gate electrode, depends upon a variety of factors, such as the dopant concentration, the mobility of the charge carriers and, for a given extension of the channel region in the transistor width direction, on the distance between the source and drain regions, which is also referred to as channel length.

There is a constant and continuous drive to increase the performance of NMOS and PMOS transistor devices. One technique for improve such performance is to reduce the channel length of the transistor device. For example, the gate length of such transistors has been dramatically reduced in the past 20 years to improve the switching speed and drive current capability of such devices. The progress has been such that current day transistor devices have gate lengths of approximately 0.3-0.8 μm and further reductions are anticipated in the future. Another technique used to increase the performance of transistor devices has been to incorporate more sophisticated materials into such devices, e.g., the use of metal gate electrodes, the use of so-called high-k dielectric materials (k value greater than 10) and the use of copper based metallization layers.

Another technique used to improve device performance is related to establishing certain stresses in the channel region of the transistors. This is typically accomplished by forming one or more layers of material, such as silicon nitride, above the transistor that imparts or induces the desired stress in the channel region of the device. In general, it is desirable to create a tensile stress in the channel region of NMOS transistors to increase their performance. In contrast, it is desirable to create a compressive stress in the channel region of the PMOS transistors. The techniques employed in forming such stress inducing layers for selective channel stress engineering purposes are well known to those skilled in the art.

One illustrative prior art technique for forming such stress inducing layers will now be described with reference to FIGS. 1A-1D. FIG. 1A is a simplified view of an illustrative semiconductor device 100 at an early stage of manufacturing that is formed above a semiconducting substrate 10. The device generally comprised an illustrative PMOS transistor 100P and an illustrative NMOS transistor 100N formed in an PMOS region 10P and an NMOS region 10N, respectively, of the substrate 10. At the point of fabrication depicted in FIG. 1A, each of the PMOS transistor 100P and the 1MOS transistor 100N includes a gate electrode structure that includes an illustrative gate insulation layer 20 that may be made of, for example, silicon dioxide, and an illustrative gate electrode 22 that may be made of, for example, polysilicon. Each of the illustrative devices 100P, 100N, depicted in FIG. 1A also includes illustrative sidewall spacers 24, source/drain regions 26, metal silicide regions 28 and isolation regions 12. The configuration and composition of these structures may also vary depending upon the application, and they may be manufactured using techniques well known to those skilled in the art. The gate electrode 22, the gate insulation layer 20, the sidewall spacers 24, the source/drain regions 26, the metal silicide regions 28 and the isolation regions 12 may be manufactured using techniques known to those skilled in the art.

The prior art process begins with the formation of a so-called stop oxide stop layer 29, e.g., silicon dioxide, above the gate electrode structures of both the PMOS device 100P and the NMOS device 100N and the substrate 10. Thereafter, a first stress inducing layer 30T. e.g., silicon nitride, is formed above the etch stop layer 29 in both the PMOS and NMOS regions 10P, 10N of the device 100. The first stress inducing layer 30T is manufactured or treated such that it will impart the desired tensile stress in the channel region of the NMOS transistor 100N. Still referring to FIG. 1A, the next step involves formation of a so-called end point oxide 32, e.g., silicon dioxide, in the PMOS region 10P and NMOS region 10N above the first stress inducing layer 30T. Then, a mask layer 34, e.g., a photoresist mask, is formed to protect the NMOS device 100N while exposing the PMOS device 100P to further processing.

Next, as shown in FIG. 1B, one or more etching process are performed to remove the end point oxide 32 and the first stress inducing layer 30T from above the PMOS region 10P. During this etching process used to remove the first stress inducing layer 30T, the etch stop layer 29 is subject to attack and erosion due to the poor etch selectivity of the etching process used to remove the first stress inducing layer 30T, e.g., silicon nitride, relative to the etch stop oxide 29, e.g., silicon dioxide. In some cases, at least portions of the etch stop layer 29 in the PMOS region 10P may be degraded to the point where at least some of the underlying metal silicide regions 28, e.g., nickel silicide, may be exposed, or the thickness of the etch stop layer 29 may be reduced such that it is no longer effective in protecting the underlying metal silicide regions 28. This degradation of the etch stop oxide 29 is schematically reflected in the reduced thickness of the etch stop oxide 29 in the PMOS region 10P of the device. In some cases, the etch stop oxide 29 is so degraded that damage to the underlying metal silicide regions 28 may occur at this point during the fabrication process. Another potential problem with the degradation of the etch stop layer 29 is that it may be so degraded in the etching process performed to remove the first stress inducing layer 30T in the PMOS region 10P that the silicon nitride spacers 24 may also be attacked during the etching process, which has the potential for weakening or eliminating the protection, i.e., nitride encapsulation, provided for the gate structure.

Next, as shown in FIG. 1C, a second stress inducing layer 30C, e.g., silicon nitride, is formed above the PMOS region 10P and NMOS region 10N of the device 100. Note that the second stress inducing layer 30C is formed above the degrade etch stop layer 29 in the PMOS region 10P. The second stress inducing layer 30C is manufactured or treated such that it will impart the desired compressive stress in the channel region of the PMOS transistor 100P. A mask layer 38, e.g., a photoresist mask, is then formed to protect the PMOS device 100P while exposing the NMOS device 100N to further processing.

Next, as shown in FIG. 1D, one or more etching process are performed to remove the second stress inducing layer 30C from above the NMOS region 10N while stopping on the end point oxide 32 in the NMOS region 100N. Typically, the end point oxide 32 is not removed in the NMOS region 10N. Rather, processing operations are commenced form conductive contacts to the source/drain regions 26 and the gate electrodes 22 of the NMOS device 10N and PMOS device 10P. This typically involves the formation of one or more layers of insulating materials (not shown) above the device 100, and thereafter forming openings in the layer of insulating material where conductive contact will be formed.

As mentioned above, one significant problem with this illustrative prior art technique is the resulting degraded etch stop layer 29 in the PMOS region 10P of the device 100. During the contact formation process an etching process will be performed to form an opening through the second stress inducing layer 30C so that a contact can eventually be made to the underlying source/drain regions 26. In theory, the etch stop layer 29 is supposed to stop the etching process performed to form the opening through the second stress inducing layer 30C. However, due to the aforementioned degradation of the etch stop layer 29 in the PMOS region 10P, the metal silicide regions 28 may be attacked and at least partially destroyed during this etching process, thereby undesirably at least increasing the resistance of the contact to be formed for the source/drain region. Such processing errors can result in the production of devices that exhibit poor or reduced performance capability, and in a worst case, devices that simply do not work.

The present disclosure is directed to various methods and resulting devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed the manufacturing of sophisticated semiconductor devices, and, more specifically, to a method forming conductive contacts on semiconductor devices that include at least dual stress liners for inducing desired stresses in the channel regions of the devices. In one example, the method includes performing a first process operation to form a first etch stop layer above a first region of a semiconducting substrate where a first type of transistor device will be formed, and forming a first stress inducing layer at least above the first etch stop layer in the first region, where in the first stress inducing layer is adapted to induce a stress in a channel region of the first type of transistor. The method further includes, after forming the first etch stop layer, performing a second process operation form a second etch stop layer above a second region of the substrate where a second type of transistor device will be formed, and forming a second stress inducing layer at least above the second etch stop layer in the second region, wherein the second stress inducing layer is adapted to induce a stress in a channel region of the second type of transistor. In one particular example, the first and second etch stop layers may have the same approximate thickness.

In an additional example, the first region is an NMOS region, the first type of transistor is an NMOS transistor, the second region is a PMOS region, and the second type of transistor is a PMOS transistor. In another example, the first region is a PMOS region, the first type of transistor is a PMOS transistor, the second region is an NMOS region, and the second type of transistor is a NMOS transistor.

Also disclosed herein is a novel semiconductor device. In one illustrative example, the novel semiconductor device includes a semiconducting substrate having a PMOS region and an NMOS region, a first etch stop layer, having a first thickness, positioned on a surface of the substrate in the NMOS region, and a first stress inducing layer positioned above the first etch stop layer. The semiconductor device further includes a second etch stop layer positioned on a surface of the substrate in the PMOS region, wherein the second etch stop layer has substantially the same thickness as the first etch stop layer, and a second stress inducing layer positioned above the second etch stop layer.

BRIEF DESCRIPTION OF THE DRAWINGS

The disclosure may be understood by reference to the following description taken in conjunction with the accompanying drawings, in which like reference numerals identify like elements, and in which.

Figure 1A:
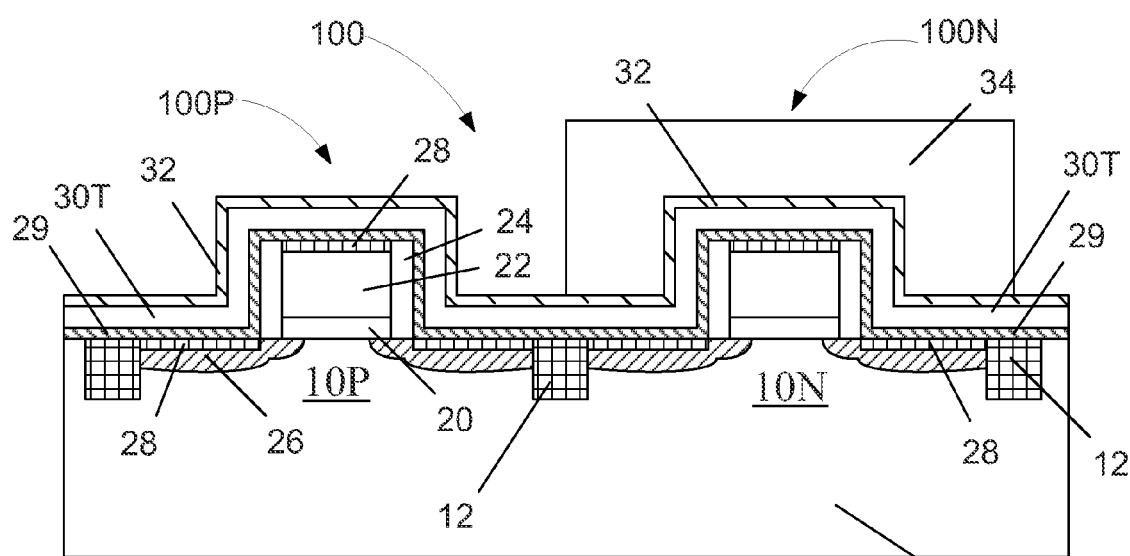
FIGS. 1A-1D schematically depict an illustrative prior art technique of forming stress inducing layers above a semiconductor device.
Figure 1B:
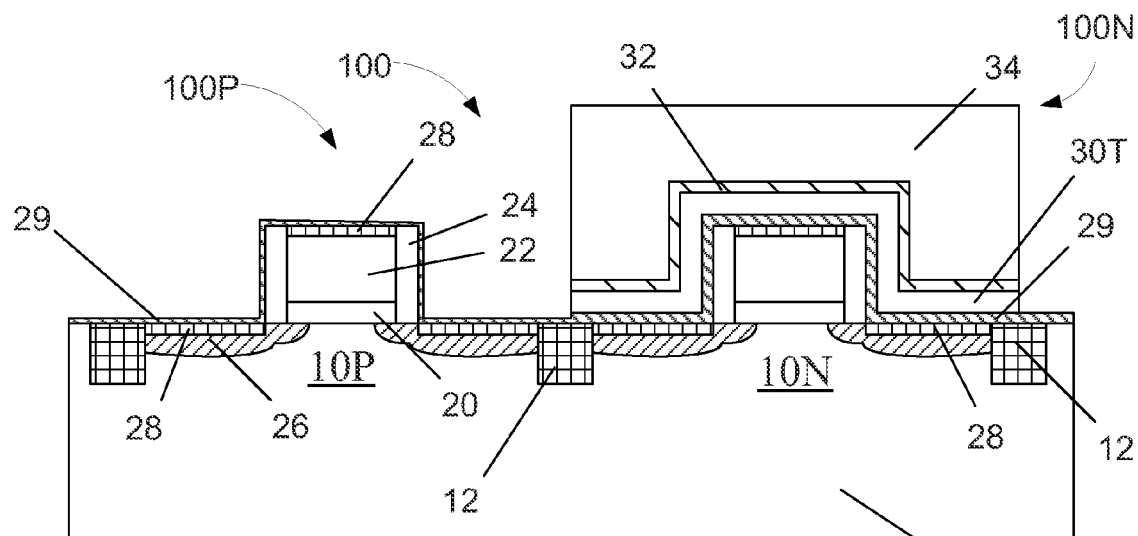
Figure 1C:
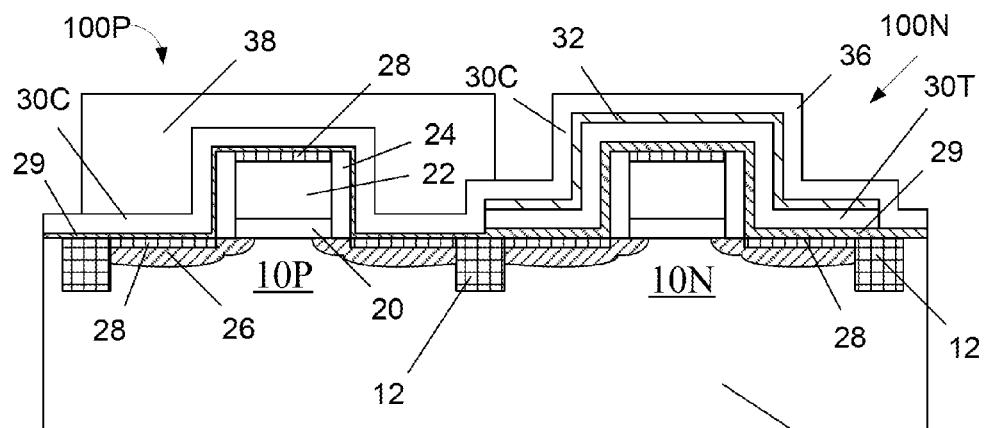
Figure 1D:
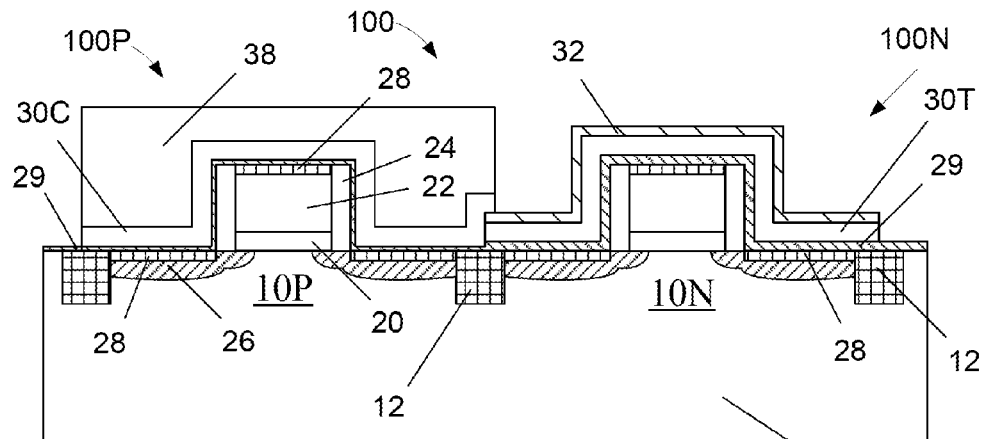

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to techniques that may be employed in forming conductive contacts on semiconductor devices while reducing or perhaps eliminating at least some of the problems discussed in the background section of this application. In some cases, the transistors may include a high-k dielectric material (k value greater than 10) and a metal-containing electrode material. As will be readily apparent to those skilled in the art upon a complete reading of the present application, the present method is applicable to a variety of technologies, e.g., NMOS, PMOS, CMOS, etc., and is readily applicable to a variety of devices, including, but not limited to, logic devices, memory devices, resistors, conductive lines, etc. With reference to FIGS. 2A-2K, further illustrative embodiments will now be described in more detail, wherein reference may also be made to FIG. 1A-1D, if required, wherein the use of the same reference number in the drawings will refer to the same structure as previously described.

Figure 2A:
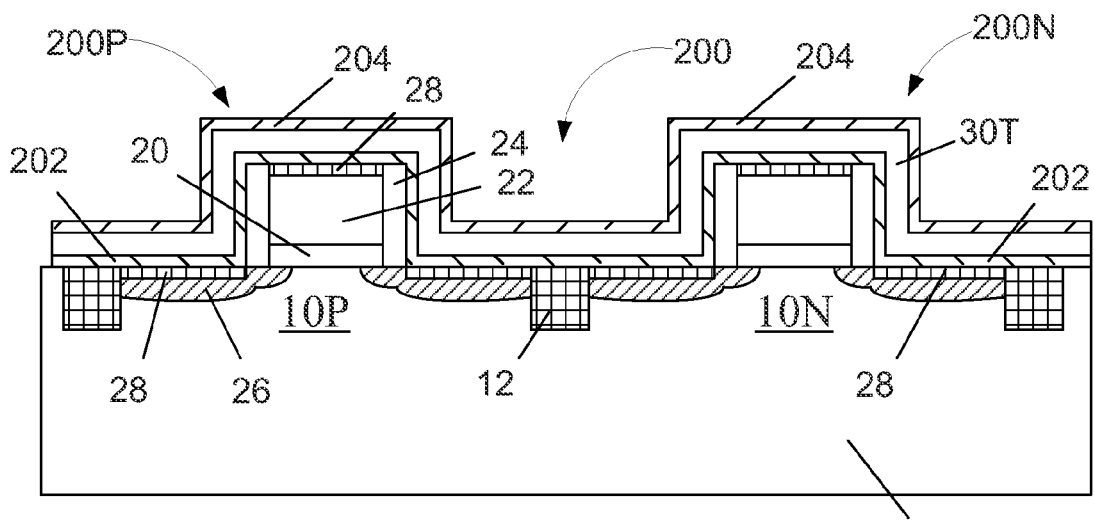
FIGS. 2A-2K depict one illustrative process flow disclosed herein for manufacturing the novel semiconductor device disclosed herein and the novel method of manufacturing such a device.

FIG. 2A is a simplified view of an illustrative semiconductor device 200 at an early stage of manufacturing that is formed above a semiconducting substrate 10. The device generally comprised an illustrative PMOS transistor 200P and a NMOS transistor 200N formed in an PMOS region 10P and an NMOS region 10N, respectively, of the substrate 10. As noted previously, the substrate 10 may have a variety of configurations, such the depicted bulk silicon configuration. The substrate 10 may also have a silicon-on-insulator (SOI) configuration that includes a bulk silicon layer, a buried insulation layer and an active layer, wherein semiconductor devices are formed in and above the active layer. Thus, the terms substrate or semiconductor substrate should be understood to cover all semiconductor structures.

At the point of fabrication depicted in FIG. 2A, each of the PMOS transistor 200P and the NMOS transistor 200N includes a gate electrode structure that includes an illustrative gate insulation layer 20 that may be made of, for example, silicon dioxide, and an illustrative gate electrode 22 that may be made of, for example, polysilicon. The gate electrode 22 may also be a so-called high-k metal gate that includes a high-k (k greater than 10) insulation layer, and one or more metal layers that act as the gate electrode 22 or as work function adjusting metals, e.g., a layer of, for example, titanium nitride, combined with a conductive layer that may be made of, for example, polysilicon, amorphous silicon, etc. As will be recognizes by those skilled in the art after a complete reading of the present application, the gate electrode structure of the device, i.e., the gate insulation layer 20 and the gate electrode 22, may be comprised of a variety of different materials and may have a variety of configurations, and they may be made using either so-called gate-first or gate-last techniques. Each of the illustrative device 200P, 200N, depicted in FIG. 2A also includes illustrative sidewall spacers 24, source/drain regions 26, metal silicide regions 28 and isolation regions 12. The configuration and composition of these structures may also vary depending upon the application, and they may be manufactured using techniques well known to those skilled in the art. For example, the illustrative sidewall spacers 24 may be comprised of silicon nitride and the metal silicide regions 28 may be comprised of nickel silicide. The sidewall spacers 24, source/drain regions 26, metal silicide regions 28 and isolation regions 12 may be manufactured using techniques known to those skilled in the art.

The process begins with the formation of an illustrative first etch stop layer 202 above the gate electrode structures of both the PMOS device 200P and the NMOS device 200N. In one illustrative embodiment, the illustrative first etch stop layer 202 may be comprised of silicon dioxide, etc., and it may have a thickness ranging from approximately 2-6 nm. The illustrative first etch stop layer 202 may be formed by any technique, such as atomic layer deposition (ALD), chemical vapor deposition (CVD), or a thermal growth process. In one particularly illustrative example the illustrative first etch stop layer 202 may be conformally deposited using a highly conformal CVD deposition process.

For purposes of this application, the present inventions will be disclosed in the context of initially forming a first stress inducing layer above the NMOS device 200N and thereafter forming a second stress inducing layer above the PMOS device 200P. However, as will be recognized by those skilled in the art after a complete reading of the present application, the subject matter disclosed herein may be applied in situation where the first stress inducing layer is formed above the PMOS device 200P and the second stress inducing layer is formed above the NMOS device 200N. Additionally, if desired, the present methods may be employed where one of both of the devices 200P, 200N, in their final configuration, include multiple stress inducing layers.

As noted previously, FIG. 2A depicts the formation of a first stress inducing layer 30T above the first illustrative etch stop layer 202 in both the PMOS and NMOS regions 10P, 10N of the device 200. In the illustrative example depicted in FIG. 2A, the first stress inducing layer 30T is intended to induce a tensile stress in the channel region of the NMOS device 200N. The first stress inducing layer 30T may be formed from a variety of materials and it may be formed using techniques that are well known to those skilled in the art. In one illustrative embodiment, the illustrative first stress inducing layer 30T may be comprised of silicon nitride, etc., and it may have a thickness ranging from approximately 20-40 nm. The illustrative first stress inducing layer 30T may be formed by any technique, such as atomic layer deposition (ALD), chemical vapor deposition (CVD), etc., perhaps followed by a UV radiation exposure step to create or enhance the desired stress in the first stress inducing layer 30T Still referring to FIG. 2A, the next step involves formation of a first protection layer 204 above the first stress inducing layer 30T. As will be discussed more fully below, one of the purposes of the first protection layer 204 is to prevent or reduce poisoning of a resist mask that will eventually be formed above the first stress inducing layer 30T. Another purpose of the first protection layer 204, as discussed more fully below, is to later serve as a hard mask for the wet etch removal of a stress inducing layer formed above the PMOS region 10P. In one illustrative embodiment, the illustrative first protection layer 204 may be comprised of silicon dioxide, etc., and it may have a thickness ranging from approximately 3-10 nm. The illustrative first protection layer 204 may be formed by any technique, such as atomic layer deposition (ALD), chemical vapor deposition (CVD), or a thermal growth process. In one particularly illustrative example the illustrative first protection layer 204 may also be conformally deposited using a highly conformal deposition process.

Figure 2B:
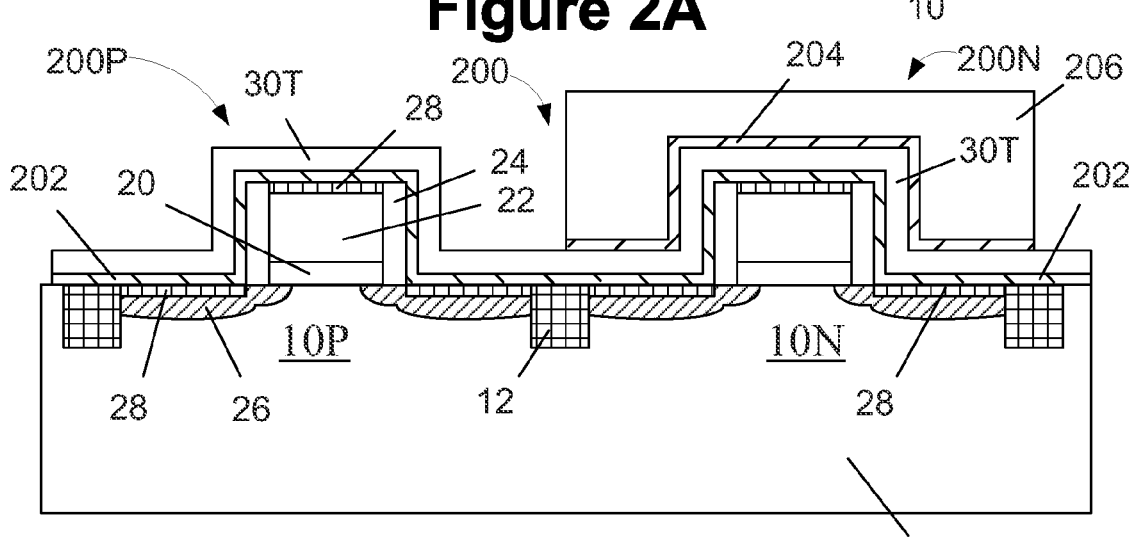

Next, as shown in FIG. 2B, a mask layer 206, e.g., a photoresist mask, may be formed to protect the NMOS device 200N while exposing the PMOS device 200P to further processing. The mask layer 206 may be manufactured using techniques that are well known to those skilled in the art. As noted previously, the first protection layer 204 acts to reduce or prevent poisoning of the mask layer 206 when the first stress inducing layer 30T is comprised of a material, such as silicon nitride, that may cause such poisoning. After the mask layer 206 is formed, and as depicted in FIG. 2B, an etching process is performed to remove the first protection layer 204 from the PMOS region 10P of the device 200. The etching process may be either a wet or dry etching process.

Figure 2C:
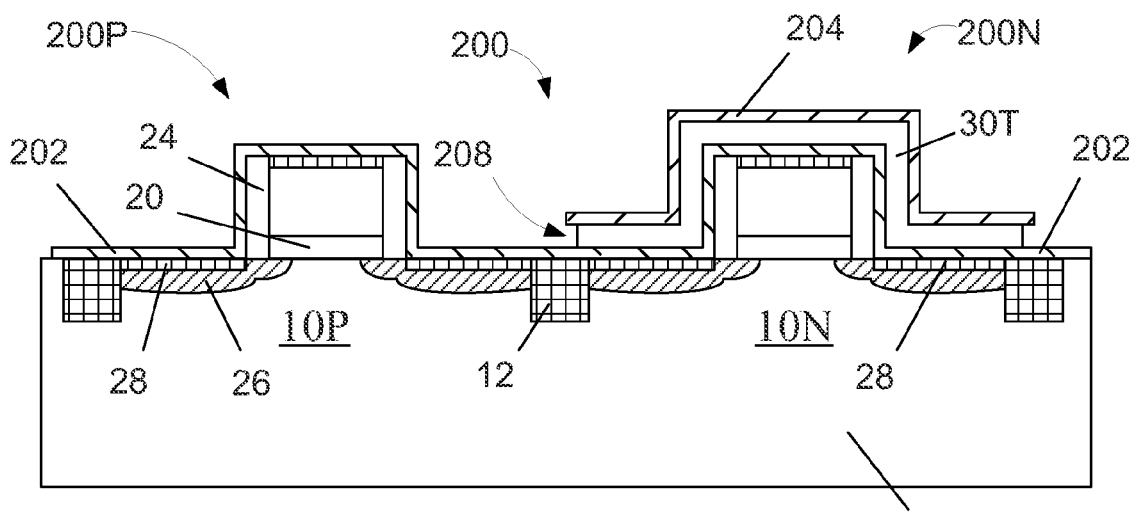

Next, as shown in FIG. 2C, the mask layer 206 is removed and an etching process is performed to remove the first stress inducing layer 30T from the PMOS region 10P of the device 200. The remaining portions of the protection layer 204 in the NMOS region 10N protects or masks the underlying first stress inducing layer 30T from removal during this etching process. The etching process performed to remove the first stress inducing layer 30T may be either a wet or dry etching process. In one particularly illustrative embodiment, when a wet etching process is performed, there may be a slight undercutting of the first stress inducing layer 30T in the region depicted by the arrow 208 in FIG. 2C. During this etch process, the illustrative etch stop layer 202 in the PMOS region 10P acts to stop the etching process and protect the underlying metal silicide region 28 in the PMOS region 10P from attack. For example, if the first stress inducing layer 30T is made of silicon nitride, then the etch stop layer 202 may be made of a material that has a high etch selectivity silicon nitride, e.g., silicon dioxide. In one particularly illustrative example where the first stress inducing layer 30T is made of silicon nitride, the etching process may be a wet etching process using a hot phosphoric acid chemistry.

Figure 2D:
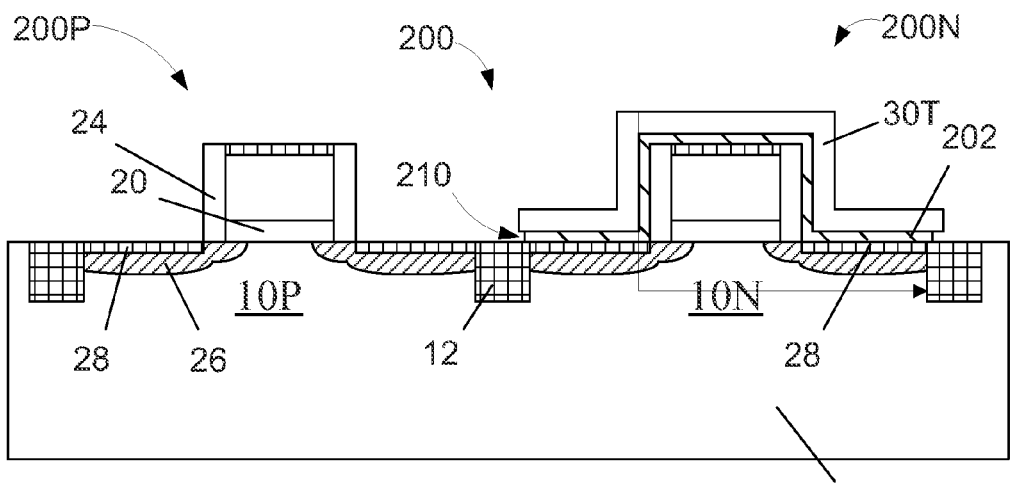

Next, as shown in FIG. 2D, an etching process is performed to remove the first protection layer 204 from above the first stress inducing layer 30T in the NMOS region 10N and to remove the first etch stop layer 202 from the PMOS region 10P of the device 200. The etching process performed to remove these layers of material may be either a wet or dry etching process. In one particularly illustrative embodiment, when a wet etching process is performed, there may be a slight undercutting of the remaining etch stop layer 202 in the NMOS region 10N of the device, in the region depicted by the arrow 210 in FIG. 2D. Ideally, the etching process used to remove the first protection layer 204 and the first etch stop layer 202 will be highly selective to the material used to form the spacers 24, so as not to significantly reduce the function of the spacers 24 to protect the gate electrode 22. In one illustrative embodiment the etching process used to remove the first protection layer 204 and the first etch stop layer 202 is a chemical dry etching process. In a more specific example, the etching process may be a dry HF isotropic etching process as disclosed in U.S. Pat. No. 7,877,161 assigned to Tokyo Electron Limited, which is hereby incorporated by reference in its entirety.

Figure 2E:
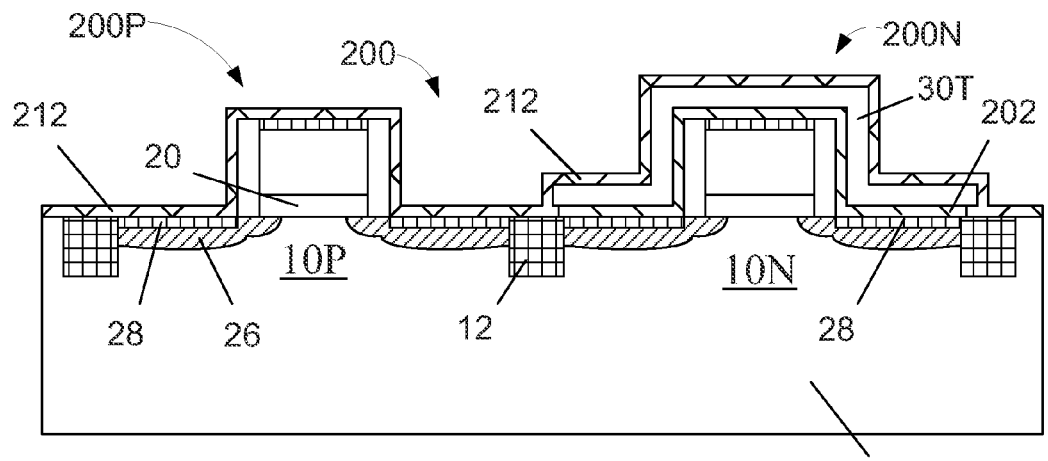

Then, as shown in FIG. 2E, the next step involves formation of a second etch stop layer 212 above the PMOS region 10P and NMOS region 10N of the device. In the NMOS region 10N, the second etch stop layer 212 is formed above the remaining portions of the first stress inducing layer 30T. As will be discussed more fully below, one of the purposes of the second etch stop layer 212 is to protect or reduce damage to the metal silicide regions 28 in the PMOS region 10P during a subsequent contact formation process. In one illustrative embodiment, the illustrative second etch stop layer 212 may be comprised of silicon dioxide, etc., and it may have a thickness ranging from approximately 3-10 nm. The illustrative second etch stop layer 212 may be formed by any technique, such as atomic layer deposition (ALD), chemical vapor deposition (CVD), or a thermal growth process. In one particularly illustrative example the illustrative second etch stop layer 212 may be conformally deposited using a highly conformal deposition process, and it may have a thickness that is the same as that of the previously formed first etch stop layer 202. As discussed more fully below, in the illustrative case where the first etch stop layer 202 and the second etch stop layer 212 have the same approximate thickness, the protection of the underlying metal silicide regions 28 in both the PMOS region 10P and the NMOS region 10N may be more readily accomplished. Of course, as described above, the first and second etch stop layers 202, 212 are not formed at the same time in the same processing operation, i.e., a later, second processing operation, e.g., a deposition process, is performed to form the second etch stop layer 212 after the first etch stop layer 202 has already been formed. The protection layer 204 in the PMOS region 10P was removed prior to forming the second etch stop layer 212 in the PMOS region 10P in an effort to ensure that the second etch stop layer 212 could be formed in a controlled and uniform manner without concern for the presence of residual and/or uneven amounts of the protection layer 204 in the PMOS region 10P.

Figure 2F:
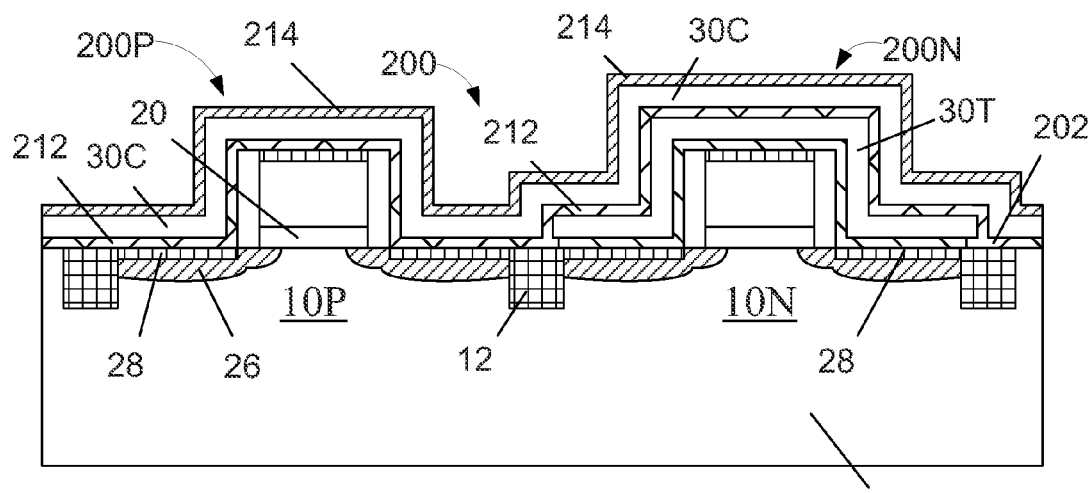

Next, as shown in FIG. 2F, a second stress inducing layer 30C is formed above the second etch stop layer 212 in both the PMOS and NMOS regions 10P, 10N of the device 200. In the illustrative example depicted in FIG. 2F, the second stress inducing layer 30C is intended to induce a compressive stress in the channel region of the PMOS device 200P. The second stress inducing layer 30C may be formed from a variety of materials and it may be formed using techniques that are well known to those skilled in the art. In one illustrative embodiment, the illustrative second stress inducing layer 30C may be comprised of silicon nitride, etc., and it may have a thickness ranging from approximately 20-50 nm. The illustrative second first stress inducing layer 30C may be formed by any technique, such as atomic layer deposition (ALD), chemical vapor deposition (CVD), etc.

Still referring to FIG. 2F, the next step involves formation of a second protection layer 214 above the second stress inducing layer 30C in both the PMOS region 10P and NMOS region 10N of the device 200. As will be discussed more fully below, one of the purposes of the second protection layer 214 is to prevent or reduce poisoning of a resist mask that will eventually be formed above the second stress inducing layer 30C in the PMOS region 10P. In one illustrative embodiment, the illustrative second protection layer 214 may be comprised of silicon dioxide, etc., and it may have a thickness ranging from approximately 3-10 nm. The illustrative second protection layer 214 may be formed by any technique, such as atomic layer deposition (ALD), chemical vapor deposition (CVD), or a thermal growth process. In one particularly illustrative example the illustrative second protection layer 214 may also be conformally deposited using a highly conformal deposition process.

Figure 2G:
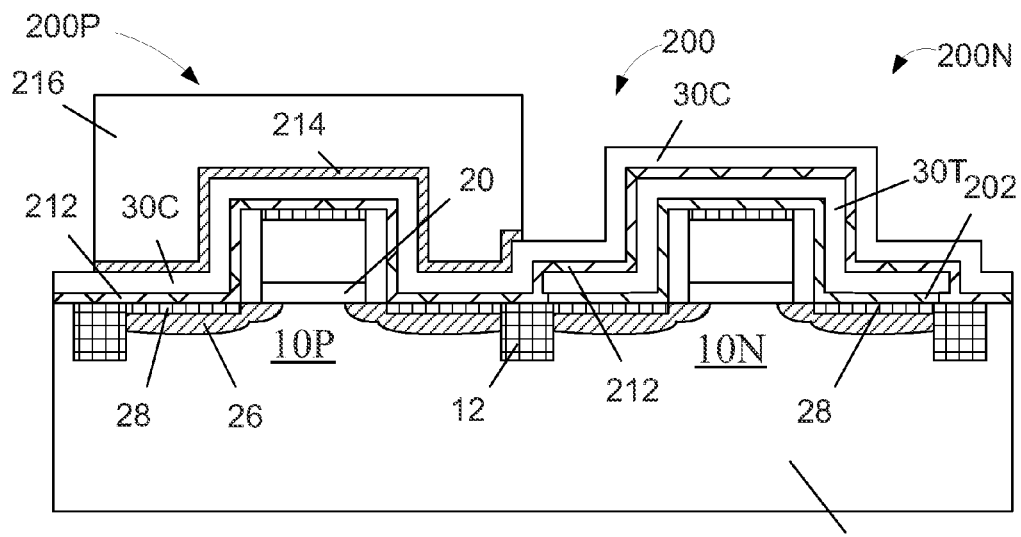

Next, as shown in FIG. 2G, a mask layer 216, e.g., a photoresist mask, may be formed to protect the PMOS device 200P while exposing the NMOS device 200N to further processing. The mask layer 216 may be manufactured using techniques that are well known to those skilled in the art. As noted previously, the second protection layer 214 acts to reduce or prevent poisoning of the mask layer 216 when the second stress inducing layer 30C is comprised of a material, such as silicon nitride, that may cause such poisoning and also as a hard mask during an illustrative nitride etching process to be performed. After the mask layer 216 is formed, and as depicted in FIG. 2G, an etching process is performed to remove the second protection layer 214 from the NMOS region 10N of the device 200. The etching process may be either a wet or dry etching process.

Figure 2H:
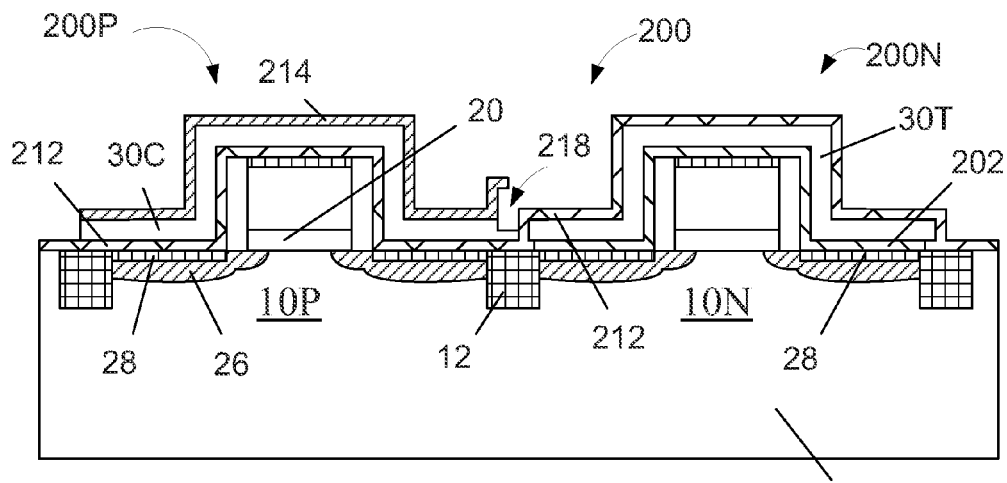

Next, as shown in FIG. 2H, the mask layer 216 is removed and an etching process is performed to remove the exposed portions of the second stress inducing layer 30C from the NMOS region 10N of the device 200. The remaining portions of the second protection layer 214 in the PMOS region 10P protects or masks the underlying second stress inducing layer 30C from removal during this etching process. The etching process performed to remove the second stress inducing layer 30C may be either a wet or dry etching process. In one particularly illustrative embodiment, when a wet etching process is performed, there may be a slight undercutting of the thickness of the second stress inducing layer 30C in the region depicted by the arrow 218 in FIG. 2H. In one particularly illustrative example where the second first stress inducing layer 30C is made of silicon nitride, the etching process may be a wet etching process using a hot phosphoric acid chemistry.

Figure 2I:
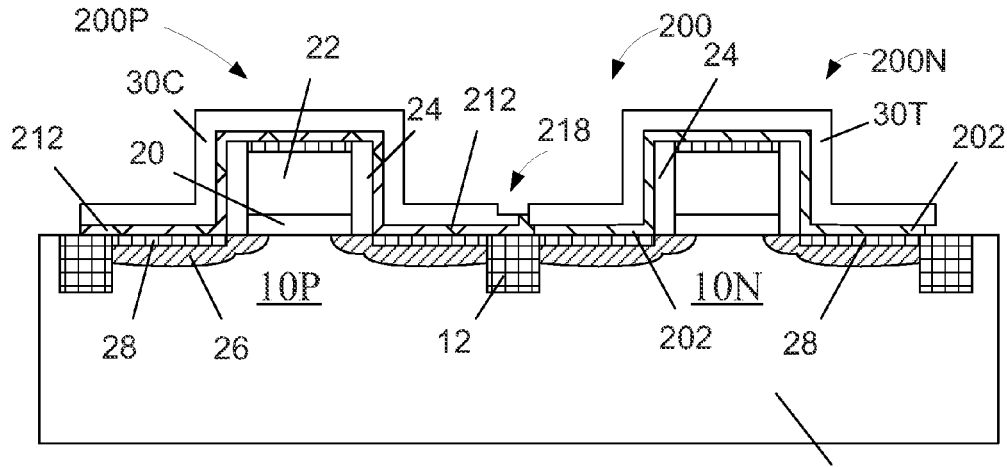

Next, as shown in FIG. 2I, an etching process is performed to remove the second protection layer 214 from above the second stress inducing layer 30C in the PMOS region 10P and to remove exposed portions of the second etch stop layer 212 from the NMOS region 10N of the device 200. The etching process performed to remove these layers of material may be either a wet or dry etching process. As a result of the processing previously described, the PMOS device 10P includes the second stress inducing layer 30C positioned above the second etch stop layer 212, while the NMOS device 10N includes the first stress inducing layer 30T positioned above first etch stop layer 202. As discussed previously, having these separately formed first and second etch stop layers 202, 212 be the same approximate thickness may facilitate protection of the underlying metal silicide regions 28 during subsequent contact formation processes.

Figure 2J:
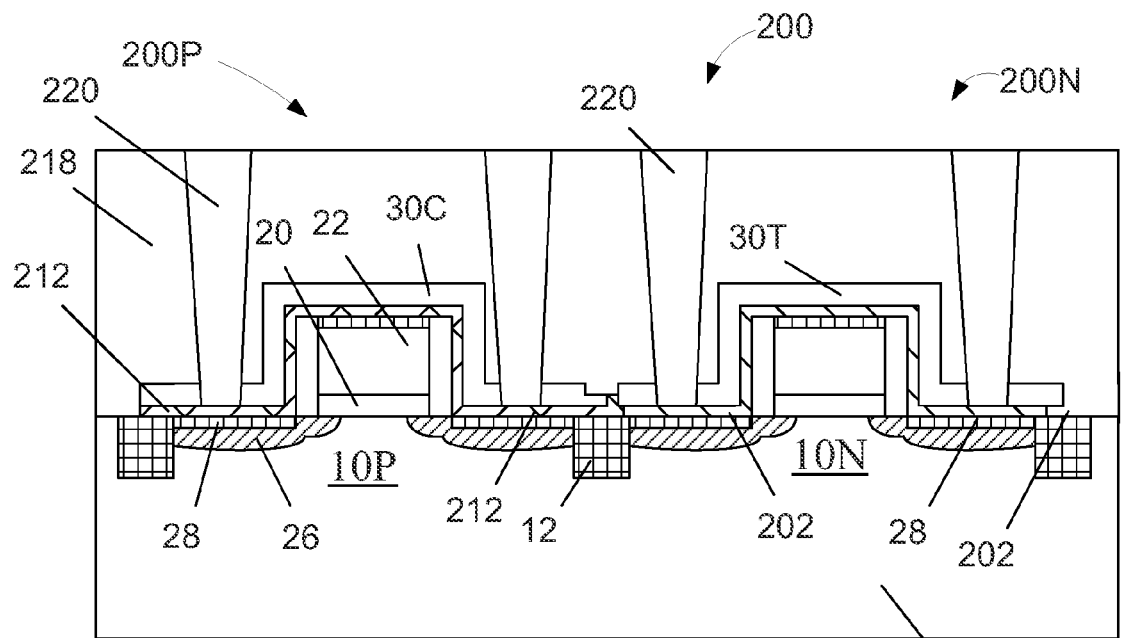

FIG. 2J schematically depicts the initial stages of the contact formation process to establish electrical contact to the underlying source/drain regions 26. Contacts would also likely be formed to the gate electrode structures during this process, but they are not depicted for purposes of clarity. An illustrative insulating layer 218 is formed above the device 200 using traditional techniques and material. An illustrative contact opening 220 is formed that extends through the insulating layer 218 and through the first and second stress inducing layers 30C, 30T, as indicated. At this point in the process, the depicted opening 220 stops on the respective first and second etch stop layers 202, 212. The openings 220 may be formed by performing one or more traditional etching processes. For example, an initial etching process may be performed to etch through the insulating material layer 218 while stopping on the first and second stress inducing layers 30C, 30T, although this stoppage is not depicted in FIG. 2J. Thereafter, the etching chemistry may be changed to one that selectively removes the material of the first and second stress inducing layers 30T, 30C, relative to the underlying first and second etch stop layers 202, 212, as indicated in FIG. 2J. That is, the removal of the first and second stress inducing layers 30T, 30C, exposes the underlying first and second etch stop layers 202, 212, as indicated in FIG. 2J. During the etching process performed to remove portions of the first and second stress inducing layers 30T, 30C, the underlying first and second etch stop layers 202, 212 protect the underlying metal silicide regions 28. Thus, applying the novel methods described herein, attacks on the metal silicide regions 28 may be reduced or eliminated as compared to the attacks on such regions as discussed in the background section of the application.

Figure 2K:
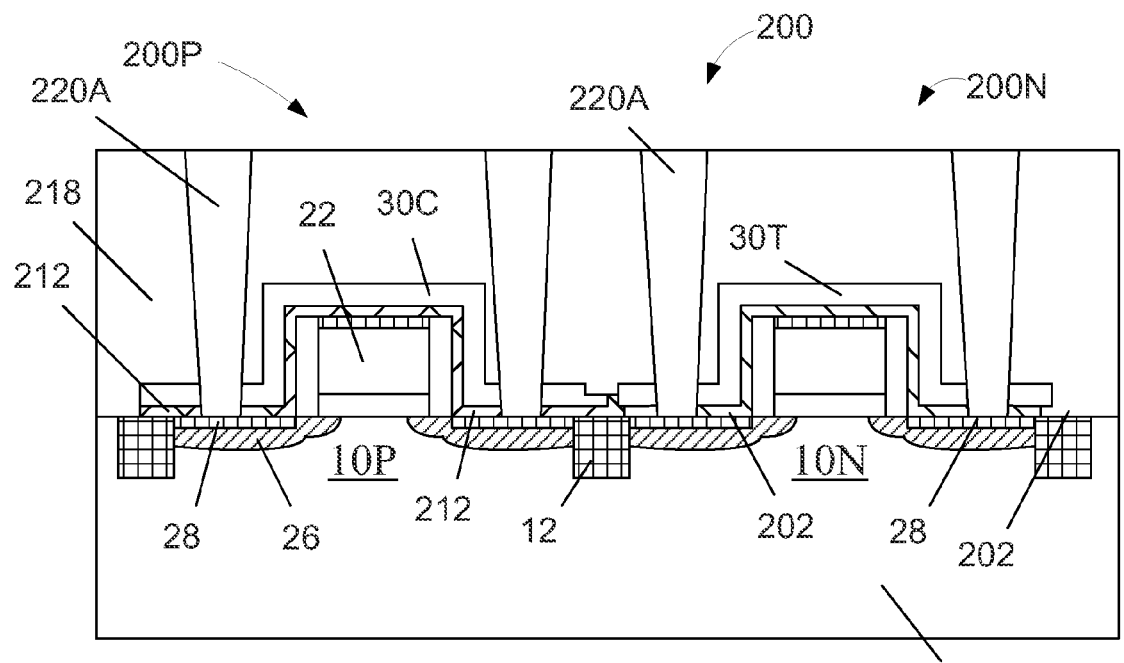

Thereafter, as indicated in FIG. 2K, an etching process may be performed to remove the exposed portions of the first and second etch stop layers 202, 212 to thereby expose the underlying metal silicide layers 28, as depicted in FIG. 2K. This etching process effectively extends the depth of the opening 20 and results in an opening 20A of increased depth. Given that the first and second etch stop layers 202, 212 are relatively thin, the removal process may be of relatively short duration, a short oxide flash, or a dry chemical etching process as previously discussed above. Then, although not depicted in the drawings, one or more conductive materials are formed in the openings 20A to form conductive contacts to the source/drain regions 26 using well known techniques. For example, one or more barrier layers may be formed in the opening 20A followed by the deposition of tungsten to fill the remainder of the opening 20A. A chemical mechanical polishing process may then be performed to remove the excess tungsten positioned above the insulating layer 218.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   performing a first process operation to form a first etch stop layer above a first region of a semiconducting substrate where a first type of transistor device will be formed and above a second region of said semiconducting substrate where a second type of transistor device will be formed;
   forming a first stress inducing layer at least above said first etch stop layer formed above said first region, said first stress inducing layer adapted to induce a stress in a channel region of said first type of transistor device;
   forming a first protection layer at least above said first stress inducing layer formed above said first region;

performing an etching process to remove said first etch stop layer from directly above said second region and to remove said first protection layer from directly above said first region;

after removing said first protection layer from directly above said first region, performing a second process operation to form a second etch stop layer at least above said second region; and forming a second stress inducing layer at least above said second etch stop layer formed above said second region, said second stress inducing layer adapted to induce a stress in a channel region of said second type of transistor device.

2. The method of claim 1, wherein said first process operation is a deposition process and said second process operation is a deposition process.

3. The method of claim 1, wherein said first region is an NMOS region, said first type of transistor is an NMOS transistor, said second region is a PMOS region, and said second type of transistor is a PMOS transistor.

4. The method of claim 1, wherein said first region is an PMOS region, said first type of transistor is a PMOS transistor, said second region is an NMOS region, and said second type of transistor is a NMOS transistor.

5. The method of claim 1, wherein said first and second etch stop layers have the same approximate thickness.

6. The method of claim 1, wherein, prior to removing said first etch stop layer from above said second region, performing a second etching process to remove a layer of material that was previously formed above said second region of said semiconducting substrate.

7. The method of claim 1, wherein said first etch stop layer is formed on a surface of said semiconducting substrate in said first region, and wherein said second etch stop layer is formed on a surface of said semiconducting substrate in said second region.

8. The method of claim 1, wherein said first and second etch stop layers are comprised of silicon dioxide and said first and second stress inducing layers are comprised of silicon nitride.

9. The method of claim 3, wherein said first stress inducing layer is adapted to induce a tensile stress in said channel region of said NMOS transistor, and wherein said second stress inducing layer is adapted induce a compressive stress in said channel region of said PMOS transistor.

10. The method of claim 3, wherein said first stress inducing layer is adapted to induce a compressive stress in said channel region of said PMOS transistor, and wherein said second stress inducing layer is adapted induce a tensile stress in said channel region of said NMOS transistor.

11. A method, comprising:
performing a first process operation to form a first etch stop layer above a first region of a semiconducting substrate where a first type of transistor device will be formed and above a second region of said semiconducting substrate where a second type of a transistor will be formed;

forming a first stress inducing layer above said first etch stop layer formed above said first and second regions, said first stress inducing layer adapted to induce a stress in a channel region of said first type of transistor device;

forming a first protection layer above said first stress inducing layer formed above said first and second regions;

performing at least one first etching process to remove said first protection layer and said first stress inducing layer from above said second region;

performing at least one second etching process to remove said first etch stop layer formed directly above said second region and to remove said first protection layer from above said first stress inducing layer formed directly above said first region;

after removing said first etch stop layer from directly above said second region, performing a second process operation to form a second etch stop layer at least above said second region of said semiconducting substrate; and forming a second stress inducing layer at least above said second etch stop layer formed above said second region, said second stress inducing layer adapted to induce a stress in a channel region of said second type of transistor device.

12. The method of claim 11, wherein said first and second etch stop layers have the same approximate thickness.

13. The method of claim 11, wherein said first etch stop layer is formed on a surface of said semiconducting substrate in said first and second regions, and wherein said second etch stop layer is formed on a surface of said semiconducting substrate in said second region.

14. The method of claim 11, further comprising forming a second protection layer at least above said second stress inducing layer formed above said second region.

15. The method of claim 14, wherein said first and second etch stop layers and said first and second protection layers comprise silicon dioxide and said first and second stress inducing layers comprise silicon nitride.

16. The method of claim 11, wherein forming said second etch stop layer at least above said second region comprises forming a portion of said second etch stop layer above said first region, and wherein forming said second stress inducing layer at least above said second etch stop layer formed above said second region comprises forming a portion of said second stress inducing layer above said portion of said second etch stop layer formed above said first region.

17. The method of claim 16, further comprising forming a second protection layer above said second stress inducing layer formed above said first and second regions.

18. The method of claim 1, wherein forming said first stress inducing layer and said first protection layer at least above said first region comprises forming a portion of said first stress inducing layer and a portion of said first protection layer above said second region, forming a patterned mask layer to cover said first region and expose said second region, and performing one or more etch processes to remove said portions of said first stress inducing layer and said first etch stop layer from above said second region.

19. The method of claim 1, further comprising forming a second protection layer at least above said second stress inducing layer formed above said second region.

20. The method of claim 19, wherein forming said second etch stop layer, said second stress inducing layer, and said second protection layer at least above said second region comprises forming a portion of said second etch stop layer, a portion of said second stress inducing layer, and a portion of said second protection layer above said first stress inducing layer formed above said first region, forming a patterned mask layer to cover said second region and expose said first region, and performing one or more etch processes to remove said portions of said second protection layer, said second stress inducing layer, and said second etch stop layer from above said first stress inducing layer formed above said first region.

* * * * *